March 26, 1968 C. O. HULL, JR., ETAL 3,375,417

SEMICONDUCTOR CONTACT DIODE

Original Filed Sept. 4, 1964

INVENTORS:
ALEXANDER M. INTRATOR,
CLIFFORD O. HULL, JR.

BY Robert J. Mooney
THEIR ATTORNEY.

United States Patent Office 3,375,417

Patented Mar. 26, 1968

3,375,417
SEMICONDUCTOR CONTACT DIODE

Clifford O. Hull, Jr., Baldwinsville, and Alexander M. Intrator, De Witt, N.Y., assignors to General Electric Company, a corporation of New York Continuation of abandoned application Ser. No. 394,456, Sept. 4, 1964. This application Dec. 7, 1966, Ser. No. 599,985

7 Claims. (Cl. 317—234)

ABSTRACT OF THE DISCLOSURE

A semiconductor contact diode comprises a pair of spaced, opposed, metallic electrodes enclosed within a hermetically sealed, glass, cylindrical casing and separated by a silicon semiconductor pellet containing both P and N regions so as to form a P-N junction. The P region of the pellet abuts an epitaxially formed, monocrystalline contact button through an aperture in a passivating layer which overlies a first major face of the pallet at the P region. The contact button is in turn connected to one of the metallic electrodes through a solder coating. The N region is connected to the other of the metallic electrodes through a soldered coating overlying the second major face of the semiconductor pellet.

This application is a continuation of application No. 394,456 filed Sept. 4, 1964, now abandoned.

The present invention relates to improvements in semiconductor signal diodes.

A principal object of the present invention is to provide an improved semiconductor junction signal diode which has a very low manufacturing cost and is physically diminutive yet exceptionally resistant to mechanical and thermal shock.

Another object is to provide a semiconductor diode of the foregoing character which is particularly suited for low cost assembly.

Another object is to provide such a semiconductor diode which includes a hermetically sealed envelope of glass.

Another object is to provide a semiconductor diode of the foregoing character, the parts of which may be assembled by a single heating operation which can be conducted in air and which simultaneously hermetically seals the glass envelope.

These and other objects of the present invention will be apparent from the following description together with the accompanying drawing in which.

Figure 1:
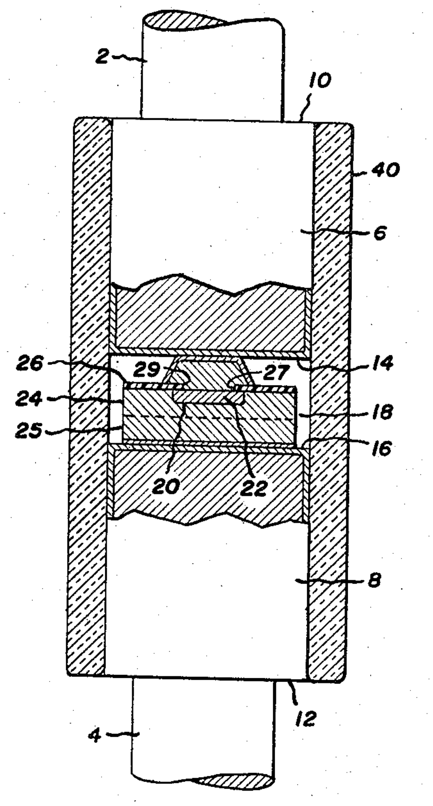
FIGURE 1 is a fragmentary view, partially broken away in axial section, of a semiconductor signal diode constructed in accordance with the present invention.
Figure 2:
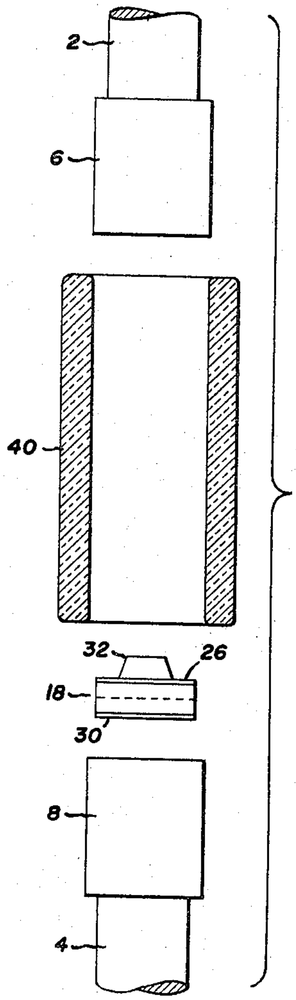
FIGURE 2 is an axially exploded view, to a diminished scale, of the structure of FIGURE 1.

Referring to FIGURE 1 of the drawing, semiconductor signal diode constructed in accordance with our invention includes two identical substantially coaxially arranged oppositely extending electrodes or leads 2, 4 of a metallic composition having a low electric resistivity and having sealing portions 6, 8 capable of being easily hermetically sealed to glass. A preferred material for leads 2 and 4 is a copper-covered nickel-iron core material known commercially as "Dumet." The sealing portions 6, 8 are of equal diameter and form axially facing shoulders 10, 12. To enhance electrical and mechanical contact thereto, the sealing portion 6 includes on its end face at least a partial covering of a metallic contact layer 14, and the end face of sealing portion 8 is likewise at least partially covered with a similar contact layer 16. The contact layers 14, 16 are plated or otherwise adhered to the end faces of the leads so as to make a good minimum electrical resistance mechanically strong contact with the remaining portions of the leads, and the material of contact layers 14, 16 is preferably copper, silver, or an alloy thereof.

Surrounding the sealing portions 6, 8 of the leads and enclosing the space between them is a cylindrical casing 40 of glass which is hermetically sealed to the cylindrical surfaces of portions 6, 8 to complete the envelope of the diode. The casing 40 can be made of glass, ceramic or other nonporous insulative material, and may preferably consist of a glass, having, for example, a working point of less than about 1000° C., and a softening point of less than about 750° C., such as Corning 0120 glass or Kimble KG12 glass.

Between the confronting contact layers 14, 16 is situated a wafer-like semiconductor pellet 18 of semiconductor material such as monocrystalline silicon or the like. Pellet 18 contains a rectifying P-N junction 20 between a thin P conductivity type region 22 and an N conductivity type region 24, the latter of which may include a lower resistivity N+ portion 25. The periphery of junction 20 is covered at one major face of the pallet 18 by an electrically insulative junction-protecting and passivating layer 26, such as silicon dioxide, having a central aperture 27 which exposes a portion of P region 22.

Figure 3:
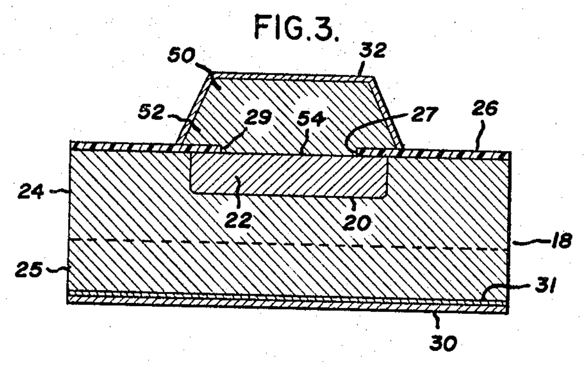
FIGURE 3 is an enlarged sectional view of a portion of the structure of FIGURE 1.

Extending upwardly from the surface of pellet 18 exposed through aperture 27 in layer 26 is an outstanding boss or contact button 50 epitaxially formed on P region 22. The epitaxial button 50 is of the same semiconductor material as that of region 22, and also is of P conductivity type. The button 50 may be deposited or grown in place on the surface of pallet 18 exposed through aperture 27 by any suitable process, such as, for example, the iodine-vapor-transport epitaxial growth process described and claimed in co-pending application, Ser. No. 385,266, filed July 27, 1964, and assigned to the same assignee as the instant application. Briefly, in the process of application Ser. No. 385,266, iodine vapor at low pressure of the order of 0.5 to 5 millimeters of mercury is used to transport semiconductor material from a source body, having an appropriate conductivity type determining impurity concentration, to an epitaxial deposition site defined by an aperture in a mask of insulating material such as silicon dioxide, and epitaxial deposition of monocrystalline semiconductor material on the desired site occurs rapidly and without deleterious effect on the mask. Other suitable epitaxial deposition techniques may be employed to form button 50, if desired. The lower portion of the side wall of boss or button 50 is fully contiguous with, and confined by, the peripheral of side walls 29 of the aperture 27 in layer 26, as best shown in FIGURE 3. The upper portion of the side wall of button 50 may, as shown at 52, extend laterally slightly out over the adjacent top surface of protecting and passivating layer 26. Thus the periphery of the interface 54 between pellet 18 and button 50 is separated or isolated from the exposed exterior surface of button 50 and layer 26 by at least the depth of the side wall of button 50 in contact with the side wall 29 of aperture 27. The layer 26 normally has a thickness of, for example, 5,000 to 20,000 angstroms and the button 50 may have a total height such as to extend above the top surface of the layer 26 a distance of a few mils.

On the top of the button is a solder layer 32 which preferably consists predominantly of a metal whose eutectic temperature with contact layer 14 is less than the sealing temperature of casing 40. Solder layer 32 preferably consists predominantly of silver, whose eutectic temperature with copper is about 780° C. The solder layer 32 is applied to the top of the button 50 by being, for example, electroplated on and alloyed in to button 50 in accordance with plating and alloy procedures known to those skilled in the art. If desired, a thin layer of gold may be plated on button 50 beneath solder layer 32 to enhance the attachment of the solder layer 32 to the button. The solder layer 32 may have a thickness of, for example, 0.1 mil.

The pellet 18 is mounted directly on the end face of one lead 4 by means of a solder layer 30 which is bonded to the major face of pellet 18 remote from layer 26. Solder layer 30 makes a eutectiferous bond with contact layer 16. The material of solder layer 30 preferably consists predominantly of a metal, such as silver, whose eutectic temperature with contact layer 16 is less than the sealing temperature of casing 40. Solder 30 can contain a small amount, such as 0.1 to 1%, of a donor impurity such as arsenic, if desired, to preclude the formation of a rectifying contact between the pellet 18 and the lead 4 to which it is attached. Solder 30 may desirably also contain a significant portion of gold, for example, 20% to 40% by weight, preferably provided at least in part by evaporating or plating of a gold undercoat, shown at 31 in FIGURE 3, onto pellet 18 as a foundation portion of layer 30. The gold undercoat 31 enhances the adherence of layer 30 to the pellet and also serves to desirably lower the melting point of the resulting silicon-silver-gold alloy during sealing of casing 40.

The pellet is mechanically and electrically connected to the end of lead 2 by its relatively thick outstanding button 50 of silicon and the eutectiferous bond of solder layer 32 with contact layer 14. The aggregate thermal coefficient of expansion of the series structure formed by the pellet 18, silicon button 50 and solder layers 30 and 32 makes a reasonably good match, e.g., is within a range of from 50 to 250%, of the thermal coefficient of expansion of casing 40 within a desired temperature range such as −60° C. to 200° C.

The pellet 18 is preferably so dimensioned that the maximum dimension across its major face is slightly smaller than the inside diameter of the casing 40, for easy entrance of the pellet into casing 40. The enlarged diameter sealing portions 6, 8 may each have a diameter of, for example, 32 mils, and a length of 70 mils, and the internal diameter of the casing 40 prior to sealing may be, for example, 34 mils.

The structure above described lends itself particularly to an assembly sequence which is extremely simple and hence can be accomplished very economically. The lead 4 can be vertically supported on shoulder 12 by a suitable fixture with its sealing portion 8 inserted up into one end of the casing 40, and the pellet 18 with the solder layer 30 pre-attached and the contact button 50 and solder layer 32 pre-attached may be then simply dropped in the upper open end of the casing 40. Thereafter, the second lead 2 may be coaxially inserted into the upper end of the casing into contact with the solder layer 32. The entire assembly may then be suitably heated for a brief period, such as 25 seconds at about 850 to 950° C. This heating temperature is sufficiently above the eutectic temperature of contact 16 and solder layer 30 to cause the solder layer 30 to alloy and bond to contact layer 16 of lead 4, and likewise to cause solder layer 32 to alloy and bond to the contact layer 14 of lead 2. Simultaneously the heating causes the end portions of the casing 40 to fuse into hermetic sealing contact with the sealing portions 6, 8 of the leads. The resistance to oxide formation of the silver in solder 30 and solder 32 at such temperature particularly facilitates reliable assembly in this fashion. Adverse effect on the pellet during the heating cycle is avoided by the short heating time required for complete assembly at temperatures sufficient to seal the casing and attach the solder layer 30 and solder layer 32.

During the heat sealing of the diode, a slight amount of axial pressure may, if desired, be supplied to compress the pellet 18, solder 30 and solder 32 between the leads, and facilitate making good solder contact in an air atmosphere. For a button 50 of, for example, a 4-mil diameter at solder layer 32, an axial pressure of about 25 grams is found to be quite sufficient to insure good soldering in an air atmosphere, and the air atmosphere enhances sealing of the glass to lead portions 6, 8.

Figure 4:
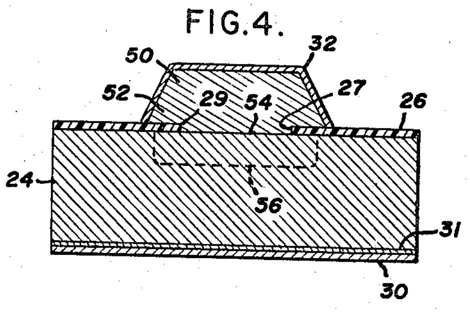
FIGURE 4 is a view similar to FIGURE 3 showing an alternative embodiment according to the present invention.

FIGURE 4 shows another embodiment of the present invention similar in all respects to FIGURE 3 except that the junction between the N region and P region of the diode pellet is formed at or near the interface 54 of button 50 on the remainder of the pellet. In this embodiment, a separate P region in pellet 18, analogous to P-region 22, is not formed in the pellet prior to deposition of contact button 50. But rather the junction of the P and N regions is established by the epitaxial deposition of P-type material of button 50 on the pellet 18, all of the surface portion of pellet 18 exposed through aperture 27 being of N conductivity type prior to deposition of button 50. If desired, an intermediate heat treatment, after deposition of button 50 but before envelope sealing, may be employed to drive some of the acceptor impurity atoms from the P-type button beyond interface 54 and down into the originally N-type pellet 18, in which case the junction may have a somewhat shifted location as illustrated by line 56 in FIGURE 4, and the periphery of the junction may be located beneath layer 26 and slightly outside the periphery of aperture 27.

The diode construction above described has many advantages. Use of the silicon contact button not only eliminates the need for the serpentine resilient connector heretofore frequently required to accommodate thermal expansion coefficient differences in diodes having hermetically sealed envelopes, but it is a particular advantage of the construction abovedescribed that the silicon pellet and the button 50 makes a sufficiently good thermal match with the casing 40 so that the assembly can be heated up to the casing sealing temperature and cooled down without any destructive effects due to thermal mismatch. Furthermore, since the portion of the P-region adjacent the P-N junction is separated from the solder 32 by the substantial thickness of silicon in the button 50, the possibility is completely precluded of the metal of solder 32 alloying into the silicon far enough to affect the P-N junction, or of otherwise adversely affecting the location or electrical characteristics of the junction during the heat sealing of the envelope. Accordingly, the envelope sealing temperature can have a higher upper limit than is the case with prior art devices having a metal contact closely spaced to the P-N junction and wherein slight alloying of such metal contact with the P-region may destroy the junction or objectionably affect its electrical properties. In practice it has been found, for example, that in devices constructed according to the present invention and employing casings of glass, sealing temperatures as high as 950° C. are feasible, without incurring any undesirable effects on the junction properties. This provides a considerably greater tolerance on the upper limit of envelope sealing temperature, and thereby not only simplifies manufacturing equipment and procedure, but also insures a higher yield of acceptable product.

The pellet 18 with its contact button 50 and solder portions 30, 32 attached does not need to be oriented end for end before insertion into the casing 40 because leads 2 and 4 are identical, and since the pellet 18 is dimensioned to have the maximum dimension of its major faces smaller than the inside diameter of the casing 40, pellet 18 can be simply dropped inside casing 40 and will land on the upfacing end of the lead therein automatically properly arranged and oriented for permanent attachment onto such end face. The pellet 18 does not require support from or contact with casing 40 but is attached to and supported exclusively by the confronting end faces of the leads.

Another advantage of the structure shown is that the direct connection of the pellet to the leads by the solder region 30 and by contact 50 and solder 32, and the relatively large transverse dimensions of the solder region 30, insures a good thermal conductivity path from pellet 18 to the leads and thus makes it possible for the leads themselves to serve as excellent heat sinks for any heat generated in the pellet during electrical operation of the diode. The relatively thick contact button 50 also provides a sufficient axial spacing between the pellet and the confronting end of the lead 2 to keep the lead from touching the pellet at its edge if the lead end face happens to be other than exactly normal to the lead axis. Finally, the reduced interior volume of the diode construction herein described gives it an inherently better resistance to crushing forces and hence makes it particularly suitable for eventual potting in an encapsulant with other circuit elements.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

We claim:

1. A semiconductor device comprising a pair of spaced opposed electrodes, a cylindrical glass casing enclosing the end portions of said electrodes and fused in hermetic sealing contact with said electrodes to form an envelope therewith enclosing the space between said opposed electrodes, a body of monocrystalline silicon semiconductor material disposed within said envelope between said opposed electrodes and spaced from said glass casing, said semiconductor body having one major face and a substantially parallel opposite major face, a layer of insulating material on said one major face of said semiconductor body having a thickness of about 5,000 to 20,000 angstroms and provided with a central aperture, a monocrystalline silicon contact button epitaxially formed on the portion of said one major face exposed by said aperture, said contact button extending through said aperture and protruding beyond said layer of insulating material in a direction normal to said layer a distance of a few mils, said protruding portion laterally slightly overlapping said insulating layer so as to leave the major portion of said insulating layer uncovered, a first metallic electrically conductive contact intermetallically bonded to said one of said electrodes and to said epitaxial contact button, a second metallic electrically conductive contact intermetallically bonded to said opposite major face of said semiconductor body and to the other of said electrodes, and a P-N junction in said semiconductor material between said epitaxial contact button and said opposite major face of said body, the periphery of said junction terminating at and being covered by said insulating layer, the thickness of said button in a direction normal to said layer providing a separation of said first metallic electrically conductive contact from said junction and the protruding portion of said button providing a spacing of said layer from said one electrode.

2. A device as defined in claim 1 wherein said layer is silicon dioxide.

3. A device as defined in claim 1 wherein said electrically conductive contact bonded to said button includes silver.

4. A device as defined in claim 1 wherein said epitaxial contact button provides a source of impurity atoms for converting the conductivity type of the adjacent portion of said semiconductor body, and said P-N junction lies between said opposite major face and the interface of said body and said button.

5. A device as defined in claim 1 wherein said electrodes are copper-covered, said casing is glass having a working point of less than 1,000° C. and a sealing temperature to said electrodes of 850° C. to 950° C., and the intermetallic bonding temperature of said contacts is less than said glass sealing temperature.

6. A device as defined in claim 1 wherein said intermetallic bonds have a melting temperature less than the sealing temperature of said casing to said electrode.

7. A device as defined in claim 1 wherein said electrically conductive contact to said button includes silver and gold, and said intermetallic bonds have a melting temperature less than the sealing temperature of said casing to said electrodes.

References Cited

UNITED STATES PATENTS

| | | | |
|---|---|---|---|
| 3,189,973 | 6/1965 | Edwards et al. | 317—235 |
| 3,200,310 | 8/1965 | Carman | 317—234 |
| 3,265,542 | 8/1966 | Hirshon | 317—234 |
| 3,296,040 | 1/1967 | Wigton | 317—234 |
| 3,300,841 | 1/1967 | Fisher et al. | 317—234 |

JOHN W. HUCKERT, *Primary Examiner.*

J. D. CRAIG, *Assistant Examiner.*